(12) United States Patent
Ma et al.

(10) Patent No.: US 9,503,028 B2
(45) Date of Patent: Nov. 22, 2016

(54) THREE-WAY SEQUENTIAL POWER AMPLIFIER SYSTEM FOR WIDEBAND RF SIGNAL

(71) Applicant: Mitsubishi Electric Research Laboratories, Inc., Cambridge, MA (US)

(72) Inventors: Rui Ma, Cambridge, MA (US); Jin Shao, Denton, TX (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/609,532

(22) Filed: Jan. 30, 2015

(65) Prior Publication Data

US 2016/0226450 A1  Aug. 4, 2016

(51) Int. Cl.
| | | |
|---|---|---|
| *H03F 3/68* | (2006.01) | |
| *H03F 1/02* | (2006.01) | |
| *H03F 1/07* | (2006.01) | |
| *H03F 3/21* | (2006.01) | |

(52) U.S. Cl.
CPC .......... *H03F 1/0277* (2013.01); *H03F 1/0288* (2013.01); *H03F 3/211* (2013.01)

(58) Field of Classification Search
USPC .......... 330/295, 124 R, 84, 286, 53
See application file for complete search history.

(56) References Cited

U.S. PATENT DOCUMENTS

| | | | |
|---|---|---|---|
| 7,884,668 B2 * | 2/2011 | Blednov | H03F 1/0288 330/124 R |
| 8,022,760 B2 | 9/2011 | Gajadharsing et al. | |
| 8,384,482 B2 | 2/2013 | Wilson et al. | |
| 8,400,216 B2 | 3/2013 | Jeong et al. | |
| 8,717,099 B2 | 5/2014 | Wilson et al. | |
| 8,736,375 B2 | 5/2014 | Murao | |
| 2013/0154731 A1 | 6/2013 | Gajadharsing et al. | |

FOREIGN PATENT DOCUMENTS

EP   2403135 A1   1/2012

OTHER PUBLICATIONS

T. Lehmann and R. Knoechel, "Sequential Power Amplifiers with Adaptable Combiners," in Proc. IEEE MTT-S Int. Microw. Symp., Jun. 2009, pp. 425-428.

* cited by examiner

*Primary Examiner* — Hieu Nguyen
(74) *Attorney, Agent, or Firm* — Gene Vinokur; James McAleenan; Hironori Tsukamoto

(57) ABSTRACT

A three-way sequential power amplifier includes an input network connected to a main amplifier, a first peak amplifier, a second peak amplifier, which in turn are connected to a three-way output network. An input signal for an input port of the input network is a wideband radio frequency (RF) signal with a time varying amplitude. An output port of the output network can be connected to an antenna, via a bandpass filter, to attenuate out of band frequencies.

6 Claims, 9 Drawing Sheets

THREE-WAY SEQUENTIAL POWER AMPLIFIER SYSTEM FOR WIDEBAND RF SIGNAL

FIELD OF THE INVENTION

This invention relates generally to radio frequency (RF) power amplifiers (PA), and more particular to three-way sequential power amplifiers (SPA) for wideband RF signals.

BACKGROUND OF THE INVENTION

RF Power Amplifiers

Wireless communication systems use spectrally efficient and complex modulation for very high data rate transmission. However, such modulation results in signal with very a high peak-to-average power ratio (PAPR), e.g., greater than 6 dB. Consequently, using a conventional radio frequency (RF) power amplifier (PA) to transmit RF signals with the high PAPR leads to a low average efficiency because the conventional PA is designed to operate with low PAPR signals. Therefore, the power efficiency is significantly reduced in a conventional single-ended PA.

Doherty Power Amplifier

One PA architecture that achieves a higher efficiency over a wide range of power levels is a Doherty power amplifier (DPA). The DPA can achieve the higher efficiency at not only peak power but also backed-off power, where the PA operates with a highest probability. In this way, using the DPA to transmit high PAPR signals has a high overall efficiency.

FIG. 1 shows a prior art Doherty PA, see U.S. Pat. No. 8,736,375. The PA includes a distributor 102, a carrier amplifier (CA) 100, a peaking amplifier (PA) 101, and a synthesizer 103. The distributor provides inputs for the CA and PA, and the synthesizer combines the outputs of the CA and PA. Input is typically an RF signal 105, and the output can be connected to an antenna 105.

FIG. 2 shows a prior art of three-way Doherty amplifier with a minimum output network, see e.g., U.S. Pat. No. 8,022,760. That three-way Doherty amplifier includes an input network 203, a main amplifier (M) 200, a first peaking amplifier (P1) 201, and second peaking amplifier (P2) 202, and an output network 204. There, the input is fed directly to the amplifiers via quarter-wavelength transmission lines in the form of microstrips 205, and the output network uses another simple structure of three transmission lines to connect to the output. That DPA has high efficiency at large power back-off, e.g., 12 dB, optimized linearity and overall efficiency. However, that three-way DPA has more impedance inverters, which severely narrows the operation bandwidth of the DPA.

Narrow Bandwidth

Although the DPA has the advantage of a high efficiency over high dynamic power levels, it also has an inherent narrow frequency band mainly due to quarter wavelength impedance inverters in the DPA, which are frequency dependent components. Some wideband DPAs are known to overcome the narrow bandwidth limitation. However, the wideband DPAs generally reduce overall gain and increase complexity. Thus, conventional DPAs are inappropriate for many wideband wireless applications.

Sequential Power Amplifier

A two-way sequential power amplifier (SPA) provides a high average power efficiency. By properly controlling the operation, and combining the output of a main amplifier (ON at both low and high power region) and a peaking amplifier (OFF at low power, ON at high power region), the SPA can efficiently amplify a dynamic envelope signal i.e., a signal where the amplitude varies over time.

FIG. 3 shows a conventional two-way SPA including an input coupler 303, a main amplifier 301, a peaking amplifier 302, and an output coupler 304. The coupler has a wider bandwidth compared with the DPA of FIG. 2.

The power combing process of the output coupler can be analyzed in term of phase and amplitude combining. The desired combing requires in-phase combining (0° phase difference) at the output port and anti-phase cancellation (180° difference) at the coupled port.

SPA Output Coupler

FIG. 4 shows the signal flow of a two-way SPA output coupler 400 that combines the power from a main amplifier 401 and peaking amplifier 402. The output coupler has a 90° delay from the input of the main amplifier to the output 403, and a 180° delay from the input of the peaking amplifier to the output 403. For in-phase combining, the power from the main and peak amplifier has a 90° phase difference. As a result, the phases at the output 403 are −180°. The signal phases at port 404 have a 180° difference from main and peaking amplifier. Therefore, at one voltage level, when the amplitude is the same, the signals can be completely cancelled, i.e., the signal has the same antiphase amplitude, resulting in a lossless power combination. At other voltage levels, there is always a power loss dissipated as heat due to incomplete cancellation. By properly selecting the coupling coefficient α and γ, and controlling the power ratio between the main amplifier at port 401, and the peaking amplifier at port 402, the output combiner can be lossless at one particular input voltage ratio, and such voltage ratio corresponds at one particular output power level. The lossless condition can be expressed as $$\text{voltage ratio} = \frac{V_{main}}{V_{peak}} = \sqrt{x-1},$$

where the voltage ratio represents the ratio between the output voltage $V_{main}$ from the main amplifier and the output voltage $V_{peak}$ from the peak amplifier, and x is the coupling fact of the output coupler (x=10 for a 10-dB coupler). Note that the phase relationship is fulfilled. The signal from main amplifier has a 90° phase delay with respect to the signal from peak amplifier. The above lossless condition shows the output combiner is lossless at the corresponding power level.

It is a challenge to design a practical passive combining network for a three-way SPA in term of the precise alignment of the phase and amplitude over a wide frequency band.

SUMMARY OF THE INVENTION

The embodiments of the invention provide a three-way sequential power amplifier (SPA). The three-way SPA structure overcomes the above described narrow bandwidths limitations of conventional 2-way DPA. In addition the proposed three-way SPA network provides a high average efficiency for high PAPR signals.

Bandwidth increments and efficiency enhancements of the three-way SPA sequential power amplifier to transmit high PAPR signals is an important feature of this invention. The three-way SPA structure provides high efficiency at increased power back-off levels to provider higher average efficiency for high PAPR signal over conventional two-way SPA.

The challenge of achieving a high performance of SPA is to design an output coupler in an output network that satisfies a lossless condition at a highest probability power lever. For example, to design a SPA for a LTE signal with 8.5 dB PAPR, the output coupler must be made lossless at 8.5 dB power back-off, as well as a low combination loss at mid to high power ranges. In this way, the lossy effect of output coupler for a high PAPR LTE signal is minimized.

DETAILED DESCRIPTION OF THE PREFERRED EMBODIMENTS

The embodiments of the invention provide a three-ways sequential power amplifier (SPA) with wideband operation and good isolation between a main amplifier and two peaking amplifier. Hence, the three-way SPA can be used for broadband wireless communications, such as Long-Term Evolution (LTE), 4G (LTE-Advanced) and Worldwide Interoperability for Microwave Access (WiMAX).

In addition, the good isolation property of the three-way SPA includes other efficiency enhancements, such as dynamic envelope tracking where the amplitude of the signal varies over time. As another advantage, the three-way SPA can maintain a high average efficiency over a greater PAPR range, e.g., greater than 6 dB. This is based on the realization that the input power to the amplifier is constant, and it is most efficient to operate the amplifier at close to maximum amplitude, because any power that is not used is dissipated as heat.

Figure 1:
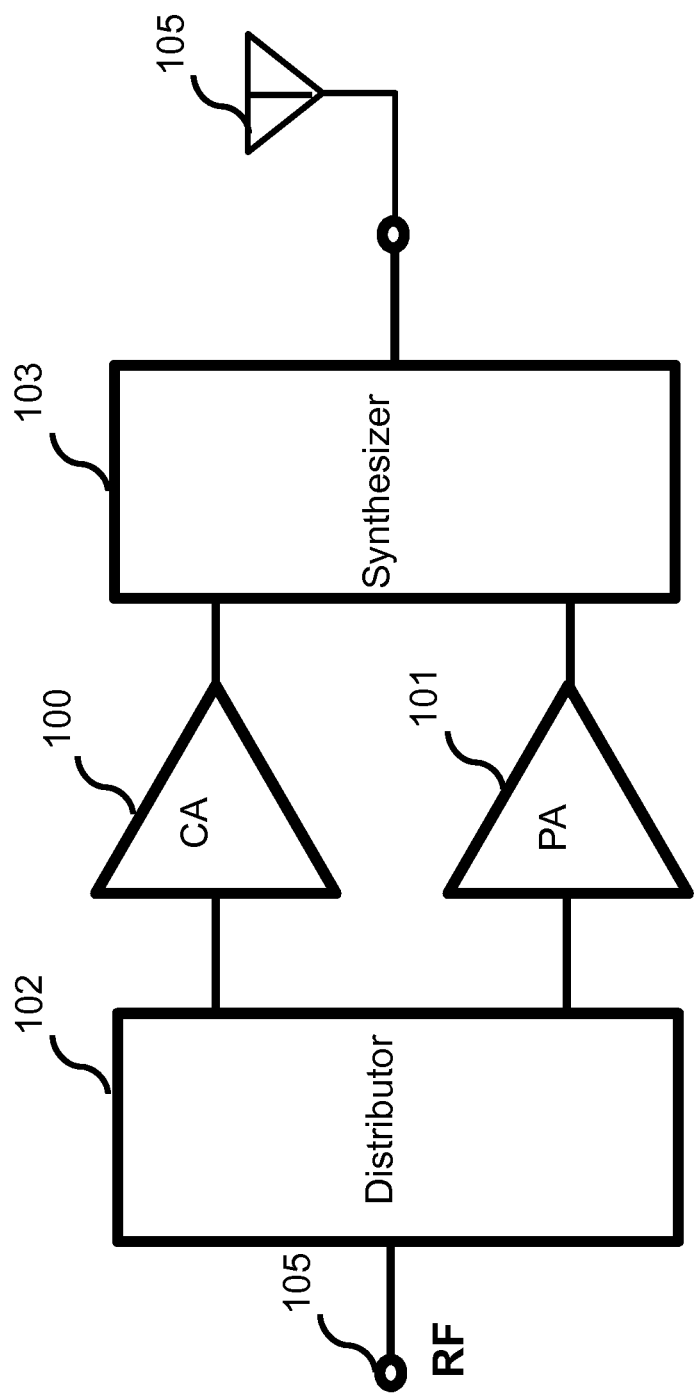
FIG. 1 is a block diagram of a conventional Doherty Amplifier.
Figure 2:
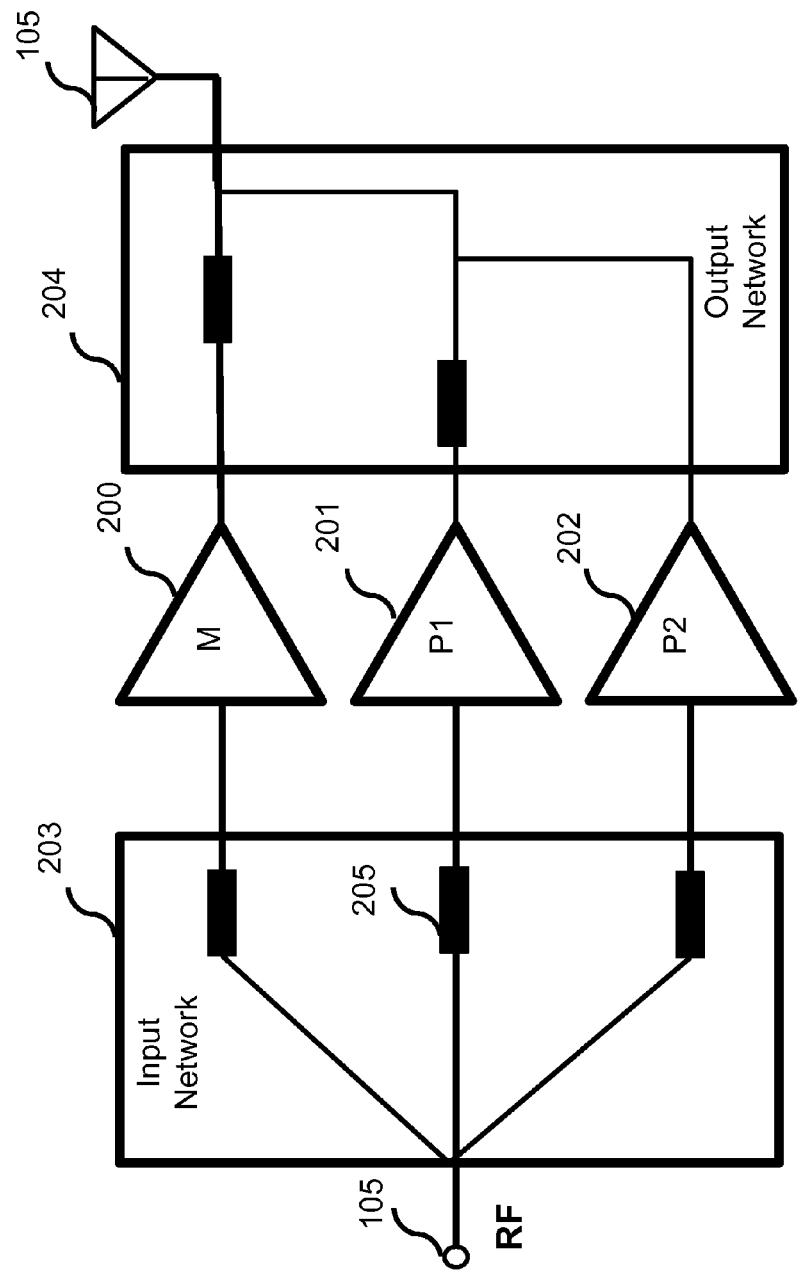
FIG. 2 is a block diagram of a conventional three-way Doherty Amplifier.
Figure 3:
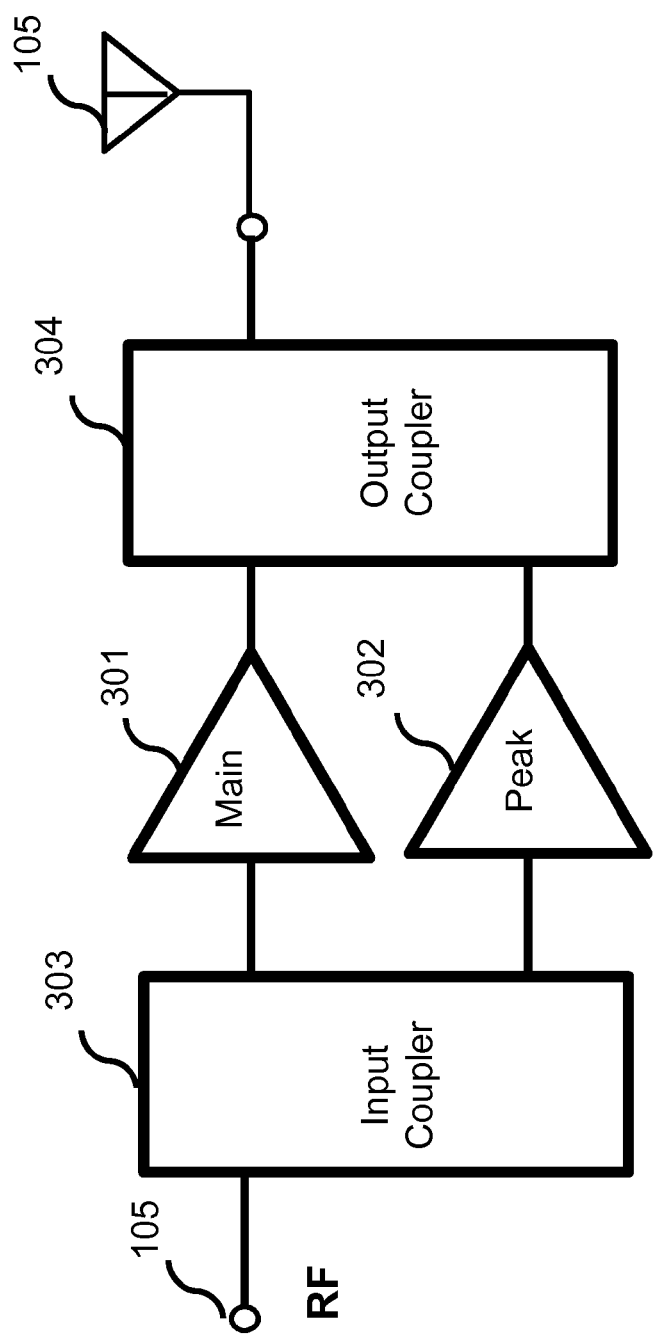
FIG. 3 is a block diagram of a conventional two-way SPA.
Figure 4:
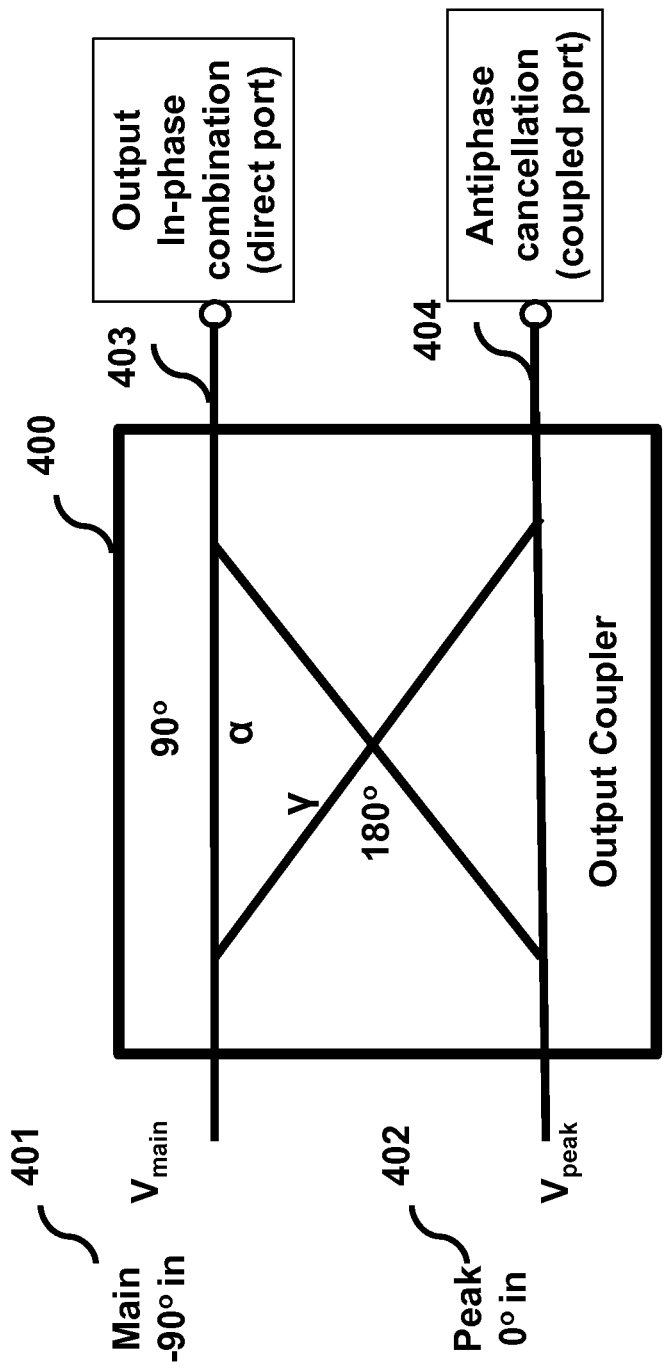
FIG. 4 is a block diagram of a conventional output coupler for a two-way SPA.
Figure 5:
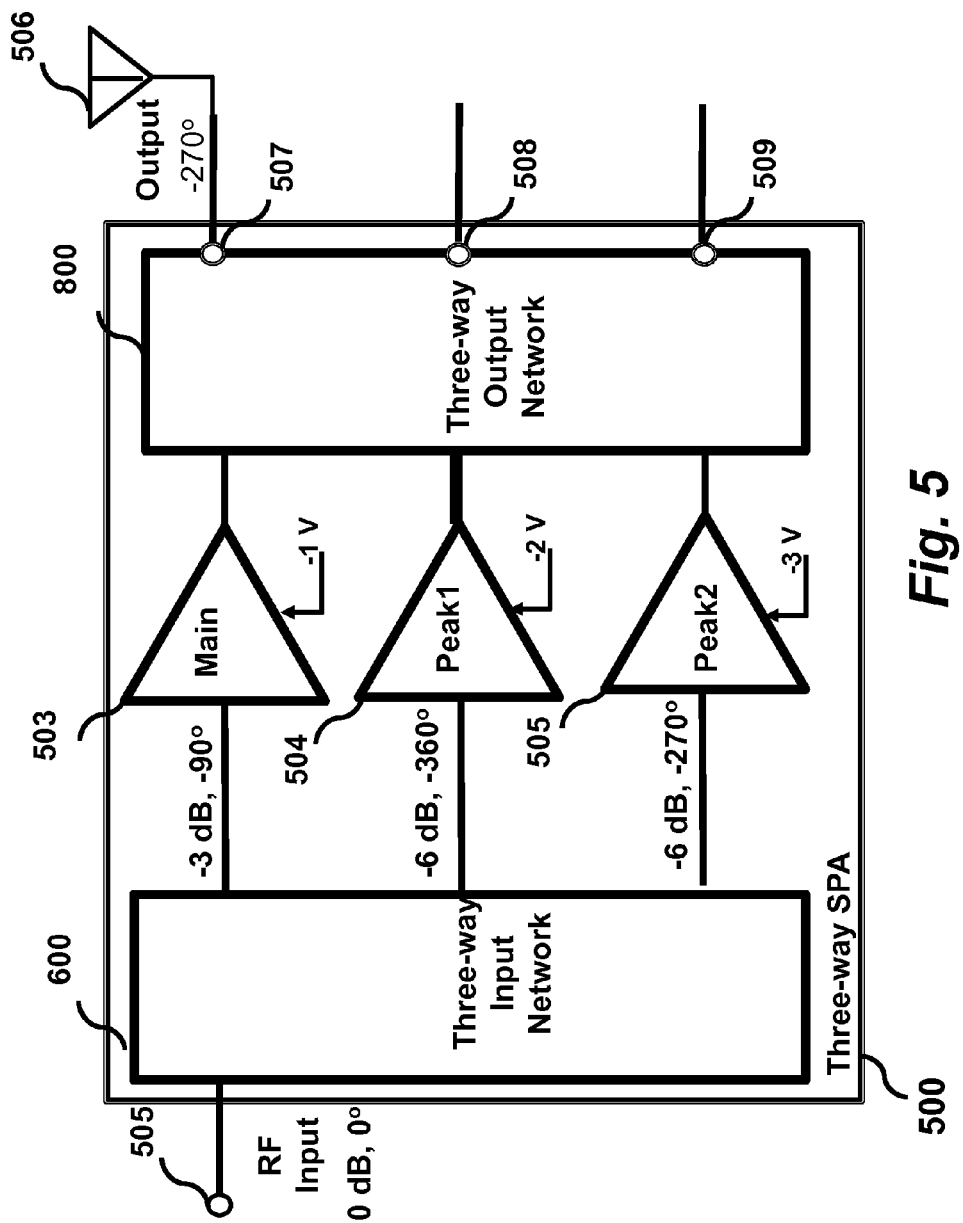
FIG. 5: is a block diagram of a three-way SPA according to embodiments of the invention.

FIG. 5 shows a block diagram of a three-way SPA 500 according to embodiments of the invention. The three-way SPA includes a three-way input network 600 connected to a main amplifier 503, a first peak amplifier (Peak1) 504, a second peak amplifier (Peak2) 505, which in turn are connected to a three-way output network 800. An input signal for an input port 505 of the input network is a wideband radio frequency (RF) signal 505 with a time varying amplitude. An output port 507 of the output network can be connected to an antenna 506 via, e.g., a bandpass filter to attenuate out of band frequencies. The output network also includes coupled ports 508 and 509.

The connectivity of the three-way SPA 500 is as follows. Outputs of the input network include a first output signal, connected to the main amplifier, having a 90° phase delay from the input signal. A second output signal, connected to the first peak amplifier, having a −360 phase delay from the input signal. A third output signal, connected to the second peak amplifier, having a −270° phase delay from the input signal. The outputs of the output network include the output signal that is an inphase combination of the outputs from the main amplifier, the first peak amplifier, and the second peak amplifier. The first coupled port 508 has an antiphase combination of outputs the main amplifier and the first peak amplifier. The second coupled port 509 has an antiphase combination of outputs from the main amplifier, the first peak amplifier and the second peak amplifier.

Bias voltages, e.g., −1, −2 and −3 volts can control when the amplifiers are ON or OFF. For example, the main amplifier is always on, and the peak amplifiers are turned ON and OFF dynamically depending on the amplitude of the input signal as described herein. The key is to amplify low and high amplitude signals equally to minimize distortion, and to amplify the median amplitudes with highest probabilities, e.g., 80% of the time, most efficiently. This is done, in part, by controlling the phases of the signal so signals arriving at the output port 507 are in phase, and signals at coupled ports 508-509 are antiphase. FIG. 5 shows example power allocations and phases of the various signals, as described in greater detail below. The power allocation for the amplitudes of the various signals described herein are based, in part, on the power density function (PDF) characterizing the input signal. The ultimate goal is to provide most efficient operation, in other words least power dissipation at the amplitude with highest probability density.

The operating frequency for the input signal 505 is, for example, in the 1 GHz range or higher for typical cellular network and microwave applications with an impedance of 50Ω at all ports. It is understood that the SPA can operate at other frequencies and impedances.

It is noted that up to this time, an actual implementation of the three-way SPA has not been shown, describe or disclosed due to the complexity of the circuit designs of the three-way input network 600 and the three-way output network 800. In other words, up to now, the details of the circuits to implement the input and output networks are no known. These two networks must provide the correct phase alignment among the main amplifier and the peak amplifiers, as well as appropriate power allocation to the amplifiers over a wide frequency range Therefore, the embodiments of the invention provide the details of the the circuits of the networks 600 and 800 to enable, for the first time, an actual implementation of a three-way SPA.

Figure 6:
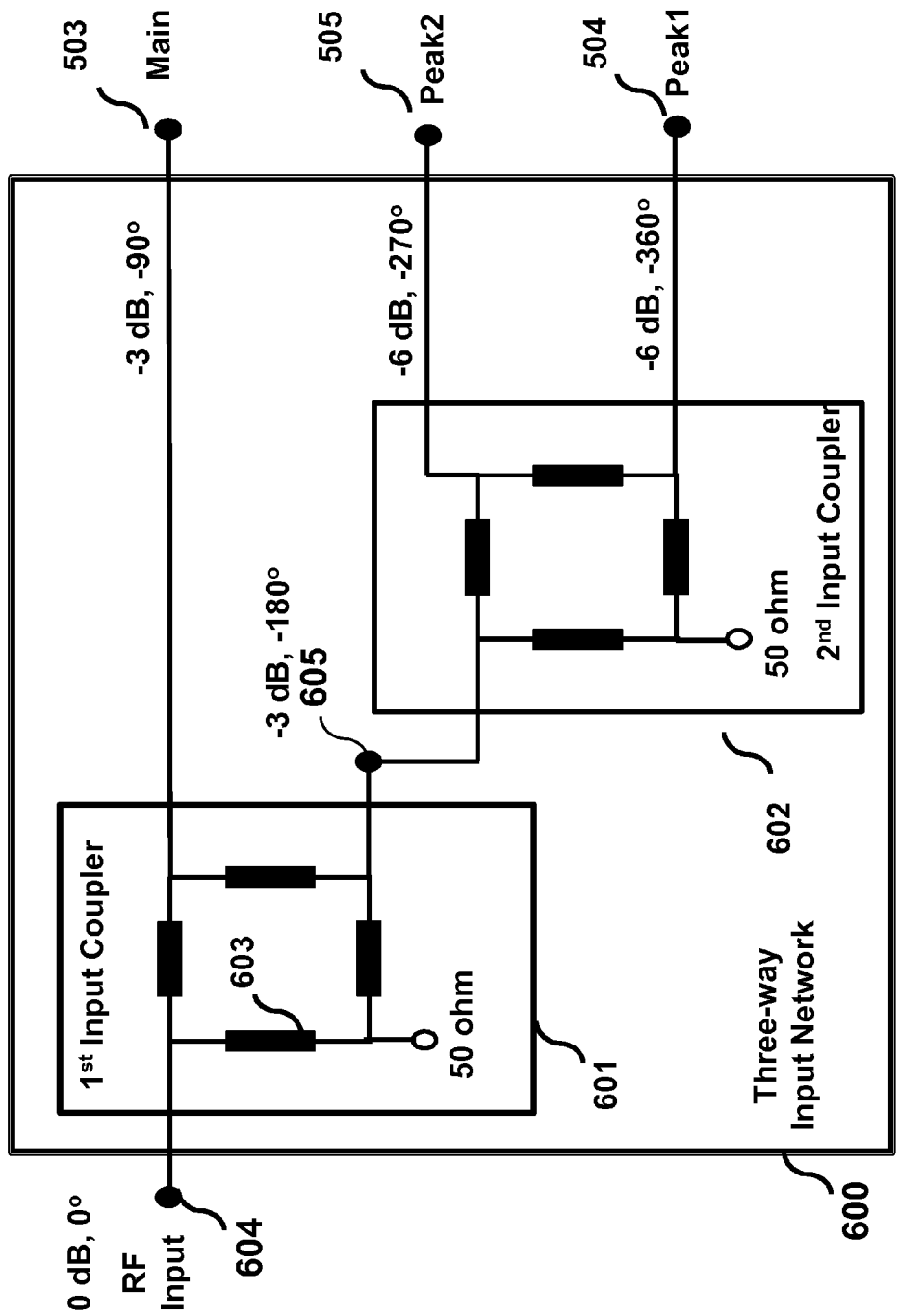
FIG. 6 is a schematic of a passive input network for the three-way SPA of FIG. 5 according to embodiments of the invention.

FIG. 6 shows the details of an example the three-way input network 600 according to embodiments of the invention. The network includes a first input couplers 601 and a second input coupler 602. Actual power ratios of the couplers depend on transistor power devices used in particular applications, as do the geometry of microstrips 603 (quarter-wavelength transmission lines) in the impedance matching network. Design parameters, including an effective width, height and length of the microstrips, as well as the relative permittivity of the substrate at which the microstrips are etched, and the electrical characteristic of the couplers, such as the impedance and phase delay. In the preferred embodiments the couplers are 3-dB couplers.

The network 600 outputs are connected to the main amplifier 503, the first peak amplifier 505, and the second peak amplifier 504. The power and phase information is shown in the figure. For example, the input to the network is a 0 dB and 0° RF input signal 604. The main amplifier 503 has a −3 dB power and −90° phase voltage. The power and phase at a junction 605 between the two 3 dB-couplers are −3 dB and −180°. For the first and second peak amplifiers 504-505, the phases of the voltage are −360° and −270°, respectively.

Figure 7:
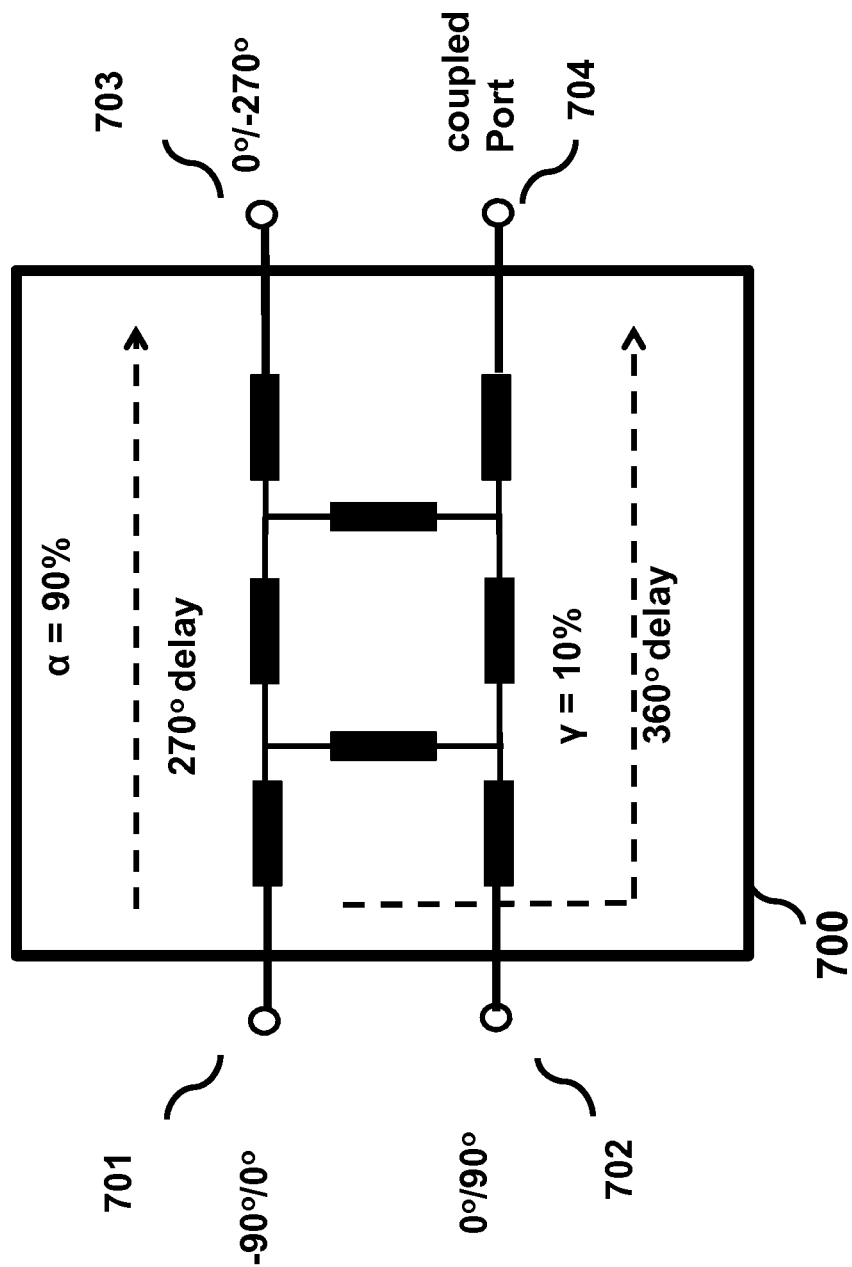
FIG. 7 is a schematic of a wideband coupler used in an output network of the three-way SPA according to embodiments of the invention.

FIG. 7 shows an example wideband coupler used in the output network of the three-way SPA according to embodiments of the invention. The wideband coupler has two input ports 701 and 702. The coupler has 270° phase delay between port 701 and port 703. To use this wideband coupler for the three-way SPA, the two input signals need to have 90° phase difference. For example, if the port 701 has −90° phase and the port 702 has 0°, the output 703 has 0° phase. If the port 701 has 0° phase and the port 702 has 90° phase, the output 703 has −270° phase. The coupler has a coupled port 704. The signals fed to the port 704 have 180° differences and therefore the combined signals are antiphase. For an ideal 10-dB coupler, α=90% and γ=10%. This means that the 90% of the power from port 701 is directed to port 703, and 10% of the power is coupled to port 704.

Figure 8:
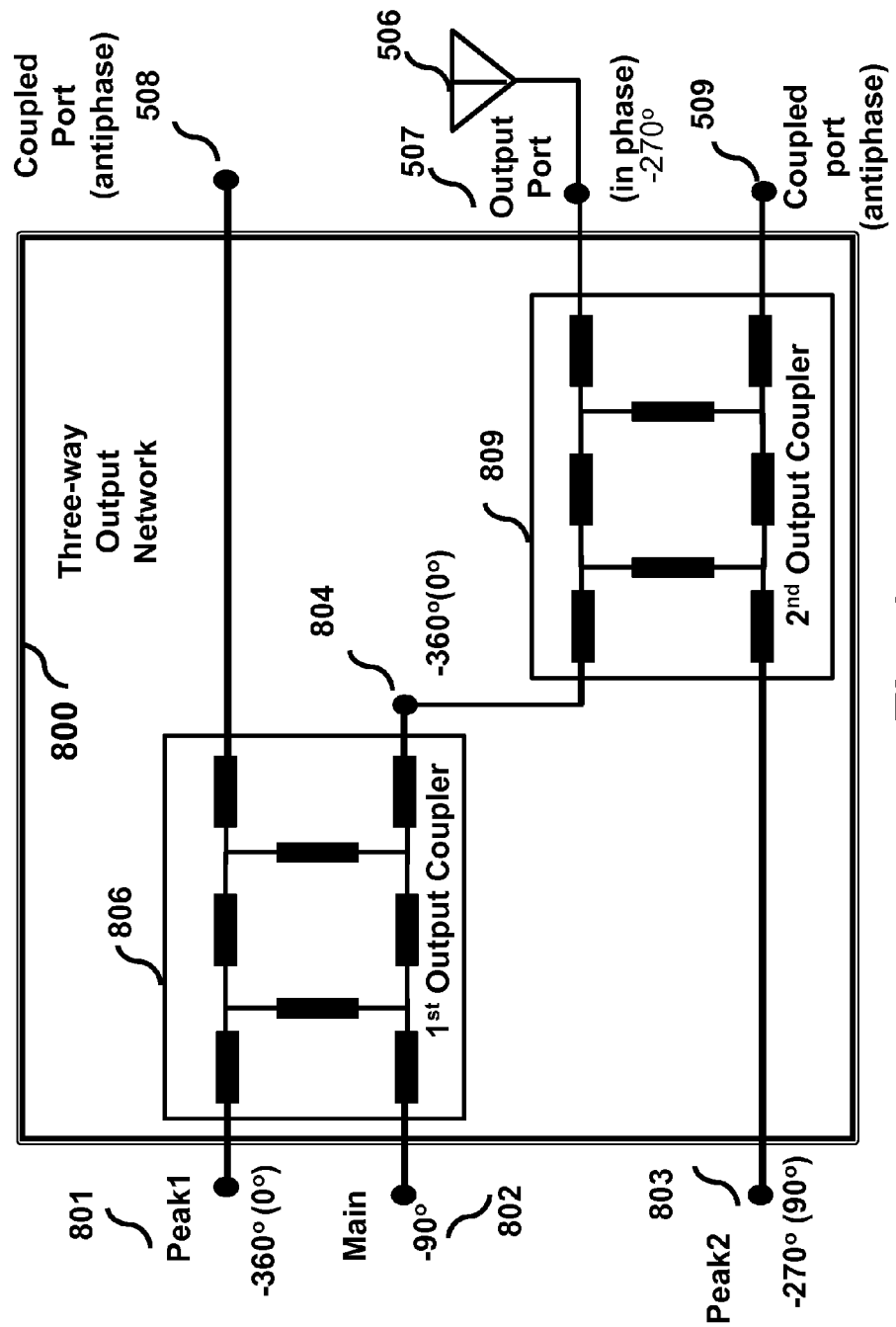
FIG. 8 is a schematic of a passive network used in the output network of the three-way SPA according to embodiments of the invention.

FIG. 8 shows the three-way output network 800. The network includes first output coupler 806 and a second output coupler 809. These couplers have a low coupling factor, e.g., 10 dB.

The main amplifier 503 and the peak1 amplifier 504 are connected with the two input ports 802 and 801 of the first output coupler 806, respectively. The phase from the main amplifier is −90°, and the phase from the peak1 amplifier is −360° (or 0°), which is the same as the input phase. Notice that these inputs have a 90° phase difference, which fulfills the phase requirement of output proper combining of the three-way SPA in-phase combination at port 804.

Coupled port 508 is a first output of the first output coupler 806, and coupled port 509 is the coupled port for the wideband coupler 809. The port 804 is the output direct port of the first wideband coupler 806, and has a phase of −360° (or 0°). Port 803 is connected to the peak2 amplifier with phase of −270° (or 90°). The output port 507 can be connected to an antenna 809 via a bandpass filter.

One insight of the invention is to maximize the amplitude of the signal at the output port 507, and minimize the amplitudes of the signals at the ports 508 and 509. This can be done by having the combined signals at the port 507 being in-phase, and the combined signals at the coupled ports 508-509 be antiphase.

The design parameters of the output voltage amplitude of each amplifier in the SPA, as well as the exact coupling ratios, are normally determined through optimization of power levels of the transistor devices, and are actually determined by the device size as well as supply voltage, and a signal statistic profile, e.g., the PAPR. The exactly turn-on positions of the peak1 and peak2 amplifiers are controlled by the bias supply voltages, input power level and device threshold voltages. FIG. 6 and FIG. 8 show implementations for wideband couplers fulfilling the strict phase relationships in the three-way SPA.

Figure 9:
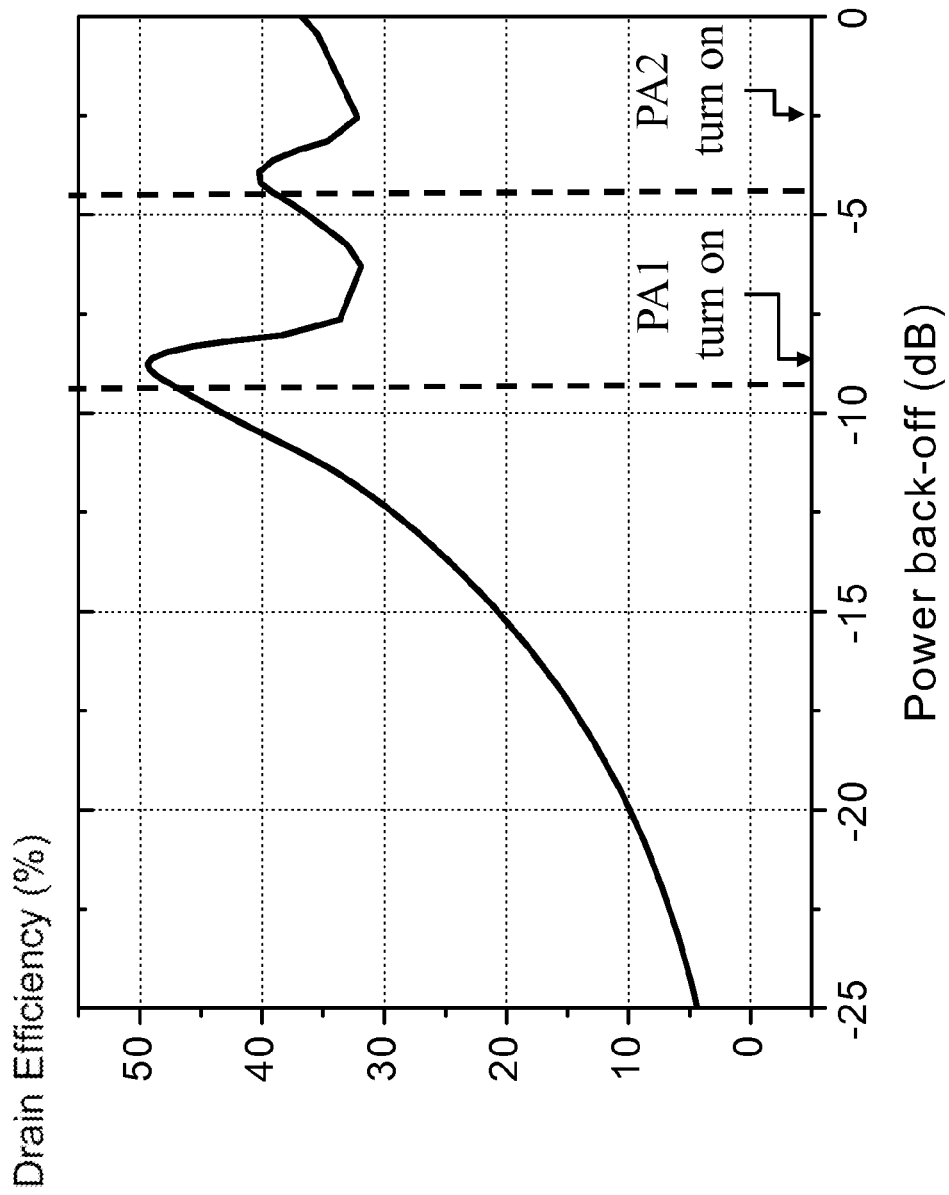
FIG. 9 is a graph of simulated performance of three-way SPA as a function of drain efficiency and power back-off according to embodiments of the invention.

FIG. 9 shows experimental result of drain efficiency as a function of power back-off for of the three-way SPA with typical transistor models for amplifier design. The peak1 amplifier and peak2 amplifiers are designed to turn ON at 9 dB back-off and at 4 dB back-off from peak power. The power levels can be controlled, for example, by gate bias voltages at the peak1 and peak2 amplifiers. Thus, the three-way SPA provides 49% efficiency at 8.8 dB power back-off, which suitable to amplifier LTE signals, because the LTE signals have a greater than 8.5 dB PAPR requirement.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A three-way sequential power amplifier (SPA), comprising:
    an input network configured to receive an input signal, wherein the input signal is a wideband radio frequency (RF) signal with time varying amplitude;
    a main amplifier;
    a first peak amplifier;
    a second peak amplifier; and
    an output network connected to outputs of the main amplifier, the first peak amplifier and the second peak amplifier, and wherein outputs of the input network comprise:
        a first output signal, connected to the main amplifier, having a 90° phase delay from the input signal,
        a second output signal, connected to the first peak amplifier, having a −360° phase delay from the input signal, and
        a third output signal, connected to the second peak amplifier, having a −270° phase delay from the input signal, and wherein outputs of the output network comprise:
    a wideband output signal that is an inphase combination of the outputs from the main amplifier, the first peak amplifier, and the second peak amplifier, and a first coupled port having the antiphase combination of outputs of the main amplifier and the first peak amplifier, and a second coupled port having the antiphase combination of outputs from the main amplifier, the first peak amplifier and the second peak amplifier.

2. The three-way SPA of claim 1, wherein a peak-to-average power ratio (PAPR) is greater than 8 dB.

3. The three-way SPA of claim 1, wherein the input network further comprises:
    a first input coupler; and
    a second input coupler, wherein an input to the first input coupler is the input signal, and outputs of the first input coupler include a input, having a −90° phase delay to the input signal, connected to the main amplifier, and an input to the second input coupler having −180° delay to the input signal, and wherein outputs of the first input coupler include an input to the first peak amplifier having a −360° phase delay to the input signal, and an output to the second peak amplifier having a −270° delay to the input signal.

4. The three-way SPA of claim 1, wherein the output network further comprises:

a first output coupler; and a second output, wherein inputs to the first input coupler include an output of the first peak amplifier, and an output of the main amplifier, and outputs of the first output coupler include an antiphase signal connected to a first coupled port and an input to the second output coupler having −360° phase delay to the input signal, and inputs to the second output coupler includes an output of the second peak amplifier having a −270° delay to the input signal, and outputs of the second output coupler include the output signal and an antiphase signal connected to a second coupled port.

5. The three-way SPA of claim 1, wherein the main amplifier is always ON, and the first peak amplifier and the second peak amplifier are dynamically controlled by a bias voltage.

6. The three-way SPA of claim 1, wherein power allocated to the main amplifier, the first peak amplifier and the second peak amplifier is determined according to a power density function characterizing the input signals.

* * * * *